(12) United States Patent
Ficken et al.

(10) Patent No.: US 6,897,712 B2
(45) Date of Patent: May 24, 2005

(54) APPARATUS AND METHOD FOR DETECTING LOSS OF HIGH-SPEED SIGNAL

(75) Inventors: Westerfield J. Ficken, Cary, NC (US); Louis L. Hsu, Fishkill, NY (US); James S. Mason, Hampshire (GB); Phil J. Murfet, Hampshire (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,799

(22) Filed: Aug. 18, 2003

(65) Prior Publication Data

US 2005/0040864 A1 Feb. 24, 2005

(51) Int. Cl.[7] ............................................... G05F 1/10
(52) U.S. Cl. ....................................... 327/537; 327/20
(58) Field of Search ............................ 327/537, 20, 21, 327/72, 65; 331/DIG. 2

(56) References Cited

U.S. PATENT DOCUMENTS

| | | | |
|---|---|---|---|
| 4,868,470 A | | 9/1989 | Bucska et al. ............... 318/561 |
| 5,512,860 A | * | 4/1996 | Huscroft et al. ............. 331/1 A |
| 6,201,424 B1 | * | 3/2001 | Harrison ...................... 327/159 |
| 6,246,268 B1 | | 6/2001 | Cheng .......................... 327/65 |
| 6,377,082 B1 | | 4/2002 | Loinaz et al. ................. 327/20 |

* cited by examiner

Primary Examiner—Timothy P. Callahan
Assistant Examiner—Cassandra Cox
(74) Attorney, Agent, or Firm—Daryl K. Neff (57) ABSTRACT

An apparatus and method is provided for detecting loss of differential signal carried by a pair of differential signal lines. According to the method, a common mode level is detected from voltages on the pair of differential signal lines. A threshold level is generated, referenced to the detected common mode level. A signal level is generated from the voltages on the pair of differential signal lines, the signal level being averaged over a first period of time. From the threshold level and the detected common mode level a reference level is generated, the reference level being averaged over a second period of time longer than then the first period of time. The signal level is compared to the reference level to determine if a signal is present on the pair of differential signal lines.

33 Claims, 9 Drawing Sheets

APPARATUS AND METHOD FOR DETECTING LOSS OF HIGH-SPEED SIGNAL

BACKGROUND OF INVENTION

The present invention relates to data communications, and more specifically to an apparatus and method for detecting loss-of-signal in a serial data communications system.

In contemporary high-speed serial data communications, a duplex high-speed serial (HSS) communication link is typically implemented by an integrated circuit ("IC" or "chip") that includes at least one pair of a serializer (transmitter) and a deserializer (receiver) on the same chip. Such elements can also be provided in the core of a multi-function chip, such core being referred to as a serializer—deserializer (SerDes) core. At a transmitting end of a serial link, the transmitter of a SerDes core takes a set of parallel data signals at a moderate switching speed and converts them to a high switching speed serial signal for transmission to a remote receiver. At the remote end of the link, another SerDes core receives the high switching speed serial signal and deserializes it back into a set of parallel data signals at a moderate switching speed.

When a serial data signal first arrives from off of the chip at the front end of a receiver, the serial data signal is processed to check whether it represents a valid signal, then the switching speed and phase of the clock are recovered from the serial data signal. The serial data signal is then sampled by the recovered clock to capture the data transmitted thereon. The signal obtained by sampling is then latched into the receiver and deserialized to provide a parallel output signal.

However, the steps of clock recovery and sampling to recover the transmitted data presume the existence of a valid serial data signal, as distinguished from a loss-of-signal condition. Unless the conductors attached at the input to the receiver are carrying a "good" serial data signal, resources and time could be wasted by the receiver processing invalid or unreliable input.

It is therefore desirable for high-speed serial data receivers to have a signal detecting apparatus to quickly and reliably distinguish a "good" serial data signal from a "bad" one. A "bad" signal can occur, for example, when conductors, e.g. a pair of conductors of a coaxial cable, that carry a signal are unintentionally disconnected, such being referred to as "loss-of-line". A "bad" signal can also occur if the signal conductors become damaged or temporarily interrupted. "Bad" signals also occur when there are voltage or current spikes on the signal conductors, as may be caused by electrostatic discharge, or inductive or capacitive coupling from interfering sources. At such times, the signal appearing on the conductors at the input to the receiver can become invalid or not reliable, appearing random, having significantly reduced amplitude, or having both signal conductors stuck at the voltage supply level (a "stuck-at-high" fault).

When loss-of-signal occurs, some types of receivers that are equipped with a decision feedback equalizer ("DFE") feature may attempt inappropriately to locate the signal by increasing the gain at the receiver's front end. In such case, instead of finding and recovering a good data signal, the receiver might instead amplify the cross-talk noise that then appears on the input signal conductors and then proceed in attempting to receive that noise as the transmitted signal. In order to avoid such outcome, it is important for the receiver to detect when the input signal is bad as early as possible. It is desirable that the receiver detects a loss-of-signal condition immediately such that an incoming data packet can then be dropped and retransmission of the packet be then requested. Such operation is critical to maintain the throughput and reliability that are needed when the receiver is used, for example, in the security, banking, trading and other industries.

Various approaches have been taken in prior art systems to determine a loss-of-signal condition. For example, in the article "A Novel High Speed CMOS Signal Transition Detector Circuit," Research Disclosure, Apr. 16, 2001, a comparator having an offset is used to determine whether the input signal has moved by a predetermined amount away from its quiescent state. If the input signal is transitioning, the detector concludes that the input signal is valid. Otherwise, if the input signal is not transitioning, the detector concludes that the input signal is not valid. However, the system disclosed in that article is not robust, possibly falsely detecting a good signal when a voltage or current spike appears, and having difficulty detecting valid signals in systems having a serial data transmission rate of 5 Gbs and higher.

In another system described in U.S. Pat. No. 6,377,082 B1 (hereinafter "the '082 patent") issued Apr. 23, 2003 to Loinaz et al., a signal detector includes (1) a transition detector for detecting stuck-on-one and stuck-on-zero loss-of-signal (L-O-S) conditions, and (2) an inconsistency detector for detecting random and undersized signals. A disadvantage of the system described in the '082 patent is that it cannot proceed without having recovered a good clock from the input data signal at the beginning of a data communication period. Hence, the input data signal must be known to be a good signal at the beginning of the data communication period in order for the clock to be recovered. The recovered clock is thereafter used to sample the input data signal in each of two different decision circuits to provide intermediate outputs for deciding whether the input data signal is valid. However, if the input signal is bad from the beginning, the clock may not be present or may be unreliable and incapable of accurately sampling the input signal, making the loss-of-signal detector fail to work at all.

Another problem of the system described in the '082 patent is that it only permits a fixed signal threshold level setting for detecting loss-of-signal. However, it is desirable for a SerDes core to operate according to multiple different specifications and support multiple different speeds and operating voltages. As a result, in communication systems using SerDes cores, a good signal threshold for one system can sometimes resemble noise in others. Therefore, a signal detector is needed in which a threshold level can vary according to conditions in which the SerDes core is actually used.

In another system, described in U.S. Pat. No. 6,246,268 B1 to Cheng, issued Jun. 12, 2001 (herein after "the '268 patent") a CMOS signal detection circuit includes (1) a low-pass filter, (2) a high-pass filter, (3) a built-in offset generator and a (4) comparator. The CMOS signal detection circuit is designed to detect an incoming differential signal within a certain frequency range and signal strength. Signals having a predetermined frequency between the cutoff frequencies of the high pass filter and low pass filter are passed to a comparator element of the detector. In the comparator, only signals strong enough to overcome a built-in offset of the comparator result in an output detection signal. As in the above system described in the '082 patent, this system also cannot operate over the wide range of signal frequencies and voltage levels that are desirable for SerDes cores.

Accordingly, a signal detector is needed which can detect the presence of an input signal within a predetermined period of time, and if not present, then the absence of an input signal.

It would further be desirable for the signal detector to function relative to a differential signal that is input to the signal detector on a pair of differential signal conductors.

It would further be desirable for the signal detector to operate over a wide range of signal frequencies, input signal common mode levels and input signal amplitudes.

SUMMARY OF INVENTION

An apparatus and method are provided for detecting loss of differential signal carried by a pair of differential signal lines. According to an aspect of the method, a common mode level is detected from voltages on the pair of differential signal lines. A threshold level is generated, referenced to the detected common mode level. A signal level is generated from the voltages on the pair of differential signal lines, the signal level being averaged over a first period of time. From the threshold level and the detected common mode level a reference level is generated, the reference level being averaged over a second period of time longer than then the first period of time. The signal level is compared to the reference level to determine if a signal is present on the pair of differential signal lines.

DETAILED DESCRIPTION

Figure 1A:
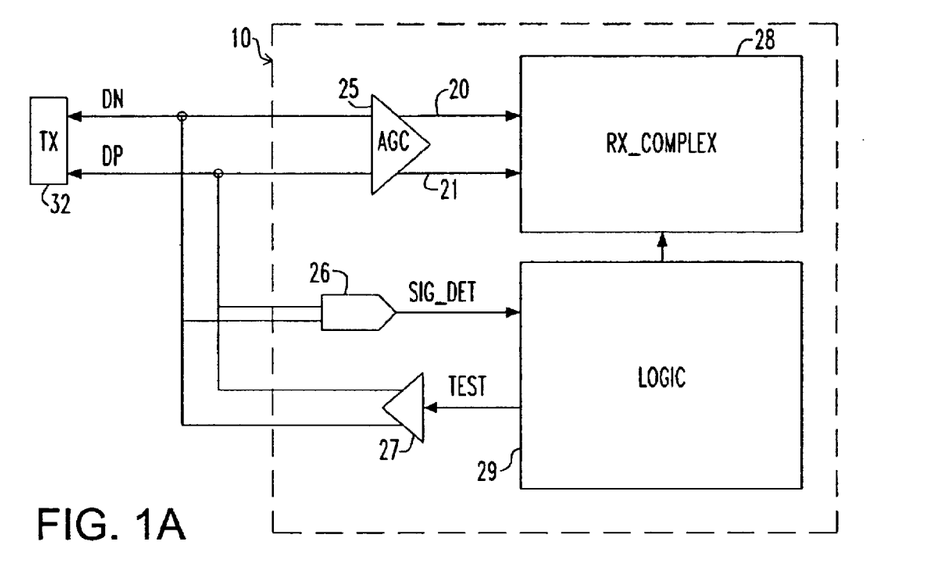
FIG. 1A is a block and schematic diagram illustrating the interconnection of and use of a signal detector according to an embodiment of the invention, at a receiving end of high switching speed serial signal.

FIG. 1A is a block and schematic diagram illustrating interconnection and use of a signal detector 26 according to an embodiment of the invention. As shown in FIG. 1A, a high speed serial signal is input to a receiving end 10 of a serial link as a difference signal between the voltages on a pair of differential signal lines (conductors) DN and DP. The differential signal on the pair of differential signal lines DN and DP is amplified to a predetermined reception level by an automatic gain controlled amplifier (AGC) 25. Thereafter, the output of the AGC 25 is input to a receiver complex 28 via lines 20 and 21, where the amplified signal is then quantized and sampled with a clock recovered from the input signal to capture the data carried by the signal.

The input signal on the pair of differential signal lines DN and DP is also input to a signal detector 26, which provides an output SIG_DET to logic block 29 to signal the presence or absence of the differential input signal. Based on the value of SIG_DET, the logic block 29 either enables or disables the receiver complex 28 from attempting to receive data from the signals input thereto on lines 20 and 21. In such way, loss-of-signal is detected quickly so that the receiver quickly stops attempting to receive the signal. Components downstream from the receiver 28 can then discard the current packet of data and/or request retransmission of the data packet.

In this example, an up-channel driver 27 is also included at the front end of the receiving end 10, the up-channel driver 27 functioning to transmit a signal onto the pair of differential signals lines DN and DP back to the remote transmitter 32 at the remote end of those signal lines. For example, test data signals are generated in logic block 29 and transmitted by the up-channel driver 27 to the remote transmitter on differential lines DN and DP in a setup or test mode of the receiver and the remote transmitter for testing the operation of the transmitter and receiver. As also shown in FIG. 1A, the up-channel driver 27 is coupled to drive the signal lines DN and DP at both the input to the receiver complex 28 through AGC amplifier 25 and at the signal detector 26. The up-channel driver 27 operates to transmit pattern data in a setup or test mode at such times to test the operation of receiver complex 28 and the signal detector 26 under the control of logic block 29.

Figure 1B:
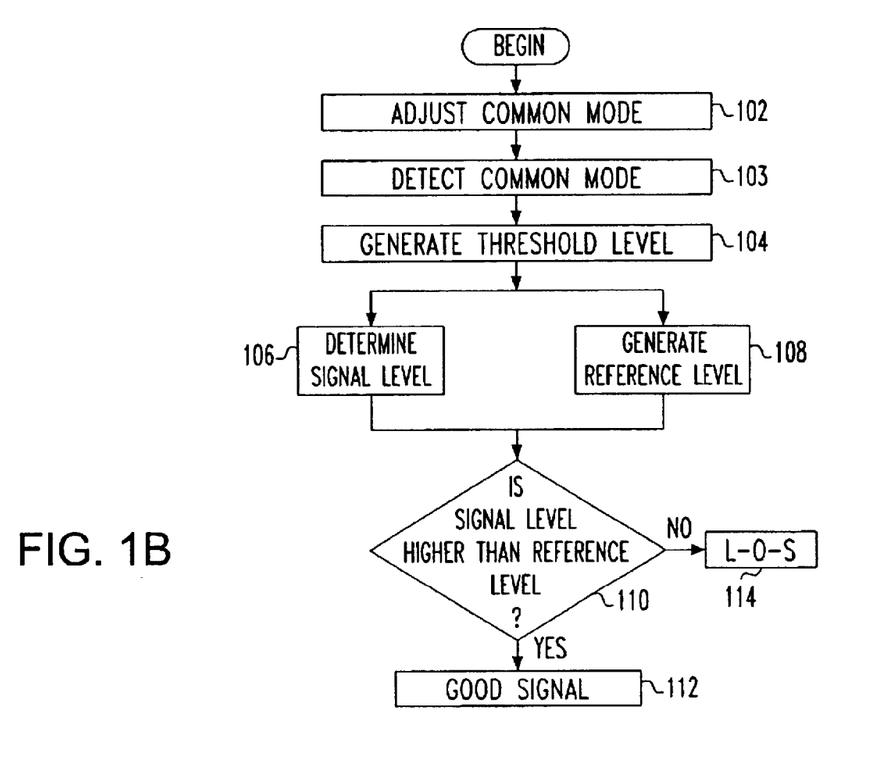
FIG. 1B is a flowchart illustrating operation according to an embodiment of the invention.

The flowchart of FIG. 1B illustrates steps in a method for detecting a loss-of-signal condition according to an embodiment of the invention. As shown in FIG. 1B, the method includes the steps, in the order shown, of adjusting the differential signal to a desirable common mode level (step 102); detecting the common mode level and generating a threshold level that is referenced to the common mode level (steps 103 and 104); determining a signal level, averaged over a first period of time (step 106); generating a reference level from the threshold level and the detected common mode level (108), the reference level being averaged over a second period of time that is longer than the first period of time; and then comparing the signal level to the reference level to determine if a signal is present (step 110). If the signal level is higher, then the signal detector 26 indicates that a good signal is present (step 112). Otherwise, a loss-of-signal condition is detected (step 114).

As will be described in further detail below, in addition to detecting faults that arise from a broken connection, e.g. broken cable between transmitter and receiver, in an embodiment of the invention the signal detector can detect a stuck-at-high loss-of-signal condition when both of the signal conductors at the input to the signal detector are shorted to the power supply voltage. In an example of operation in which the input signal conductors DN and DP exhibit a stuck-at-high condition, both the detected common mode level and threshold level will be at the supply voltage Vdd. In such case, the comparator will stay low, and no signal will be detected.

By adjusting the threshold level, the signal detector 26 can be used to detect signals having different signal frequencies. Alternatively, loss-of-signal can be detected in communication systems having different data patterns, for example, a pattern of alternating ones and zeroes, or other pattern alternating between five consecutive ones and five consecutive zeroes, or even in patterns involving pseudo-random bit sequences. By adjusting the threshold level, the signal detector 26 can also be used to detect signals when the signal detector 26 is operated in different receiver systems having different power supply levels. Desirably, the signal detector 26 detects the presence and absence of a signal within a preset sampling time, e.g. 100 ns, and functions reliably over a wide temperature range, e.g. from 0 degrees C. to 125 degrees C., and within tolerances for variations in the manufacturing process for the chip which houses the SerDes core.

Figure 2:
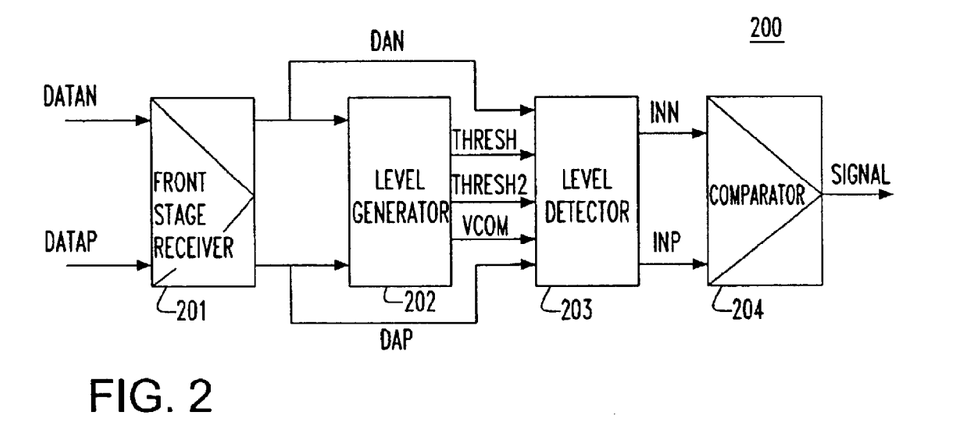
FIG. 2 is a block and schematic diagram illustrating elements of a signal detector according to an embodiment of the invention.

An embodiment of a signal detector 200 according to the invention will now be described, with reference to the block and schematic diagram of FIG. 2. As shown in FIG. 2, the signal detector 200 includes a front stage receiver 201, a level generator 202 coupled to receive output therefrom, a level detector 203 coupled to receive output from the level generator 202 and the front stage receiver 201, and a comparator 204 coupled to the level detector 203 for comparing a signal level detected by the level detector 203 to a reference level generated thereby to determine whether a signal is present or absent on the incoming signal lines DATAN and DATAP.

The function of each one of the above-listed elements of the signal detector 200 will now be described in detail. Signal detector 200 is required to be versatile to support a variety of physical layers of communication protocols supported by the SerDes core. Desirably, the signal detector 200 should operate at a variety of frequencies of incoming signals, ranging from 125 Mbs (Megabits per second) to 10 Gbs (Gigabits per second), for example. The signal detector should also desirably operate at a variety of power supply levels, e.g. from 1.0 V to 2.5 V, and at temperatures ranging from 0 degrees C. to 125 degrees C.

Signal detector 200 must be capable of detecting signals even when the common mode level varies significantly from one operational mode to another. Thus, the signal detector must be capable of detecting L-O-S for differential signals that have a high common mode voltage. In a direct current (DC) coupling mode of operation, differential signals swing between the voltage supply level VDD and a lower level. Thus, the common mode level of differential signals in a DC coupling mode is close to the voltage supply level, being about VDD minus one half of the voltage signal swing. The high common mode level of the DC coupling mode is contrasted with that of alternating current (AC) coupling mode, wherein the common mode is generally set to a fraction of the voltage supply level VDD.

In order for the signal detector 200 to function for both AC coupling mode and also in a DC coupling mode of operation when the common mode of the differential signals is near the voltage supply level, a way is needed to adjust the common mode of the differential signals to a desirable level.

Figure 3A:
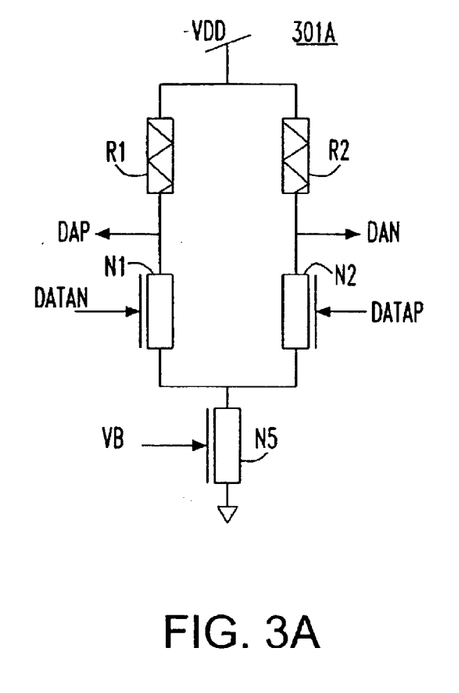
FIG. 3A is a schematic diagram illustrating a common source amplifier for use as a front stage receiver element of a signal detector according to an embodiment of the invention.
Figure 3B:
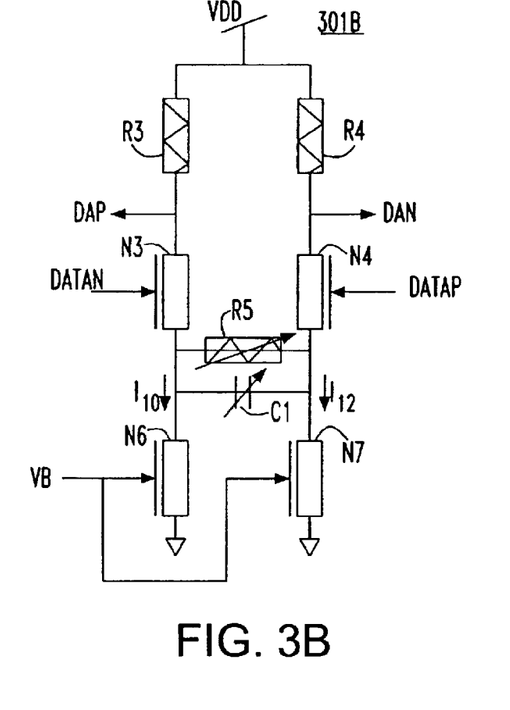
FIG. 3B is a schematic diagram illustrating a peaking amplifier for use as a front stage receiver portion of a signal detector according to an embodiment of the invention.

The front stage receiver 201 of the signal detector 200 is used to buffer amplify the differential signals DATAN and DATAP input thereto and to adjust the common mode level thereof to a desirable level. Options for implementing the front stage receiver 201 are illustrated in FIGS. 3A and 3B. As shown in FIG. 3A, a first version of a front stage receiver 201 includes a common source differential amplifier 301A. The amplifier 301A includes a pair of input devices N1 and N2 being n-type field effect transistors (NFETs), having gates coupled to the incoming differential signals DATAN and DATAP, respectively. Another NFET N5 having a gate tied to a constant biasing voltage VB provides a biasing current for the pair of input devices N1 and N2, the drain of N5 being coupled to sink current from the sources of N1 and N2.

The differential amplifier 301A additionally includes a pair of load resistors R1 and R2 coupled between the voltage supply VDD and input devices N1 and N2. The output signals DAN and DAP appear at the drains of the NFETs N1 and N2 as follows. When a signal DATAN is input to the differential amplifier 301A that is higher than a signal DATAP, N1 will be turned on to a greater extent than N2, such that the DAN output at the drain of N2 will be at a high level close to the voltage supply level VDD, while the DAP output at the drain of N1 will be pulled down to a level which is closer to ground, due to the voltage drop from VDD across resistor R1. In such manner, the differential amplifier 301A converts a pair of differential voltages DATAN and DATAP of a signal pair having a relatively high common mode level to the differential voltages DAN and DAP having a lower common mode level. The values of R1, R2 and the biasing current through N5 are preferably selected such that the differential amplifier 301A provides a gain of close to unity or slightly higher.

A second, alternative version of a front stage receiver 201 is illustrated in FIG. 3B. This version, known as a degenerated peaking amplifier 301B, is preferably employed when the incoming signals have high frequencies. As in the common source differential amplifier 301A illustrated in FIG. 3A, the peaking amplifier 301B includes a pair of load resistors R3 and R4 coupled to the voltage supply level VDD and a pair of input NFET devices N3 and N4 having gates coupled to the incoming differential signals DATAN and DATAP. The NFETs N6 and N7 are sized and biased to provide equal biasing current sources for operating the input devices N3 and N4.

In contrast to the common source differential amplifier 301A, the peaking amplifier 301B also includes a degenerating resistor R5 and a parallel (shunt) capacitor C1 which are placed across the sources of input devices N3 and N4. At lower frequencies, the peaking amplifier 301B operates much like the differential amplifier 301A, except that a biasing current $I_{10}$ through N6 drives the output level at the drain of N3, while a separate biasing current $I_{12}$ through N7 drives the output level at the drain of N4. At such lower frequencies, comparatively little current flows between the sources of input devices N3 and N4 through resistor R5 and shunt capacitor C1.

In operation, the impedance Z(C) of a shunt-connected capacitor varies inversely with frequency f according to the relation $Z(C)=1/j(2\pi f)C$ where C is the capacitance value and Z(C) is the impedance. Consequently, the shunt capacitor C1 provides a low impedance path for higher frequency AC currents. The result is increased gain at the higher frequencies, such that the bandwidth of the peaking amplifier 301B is extended to higher frequencies in relation to the common source differential amplifier 301A.

Figure 4A:
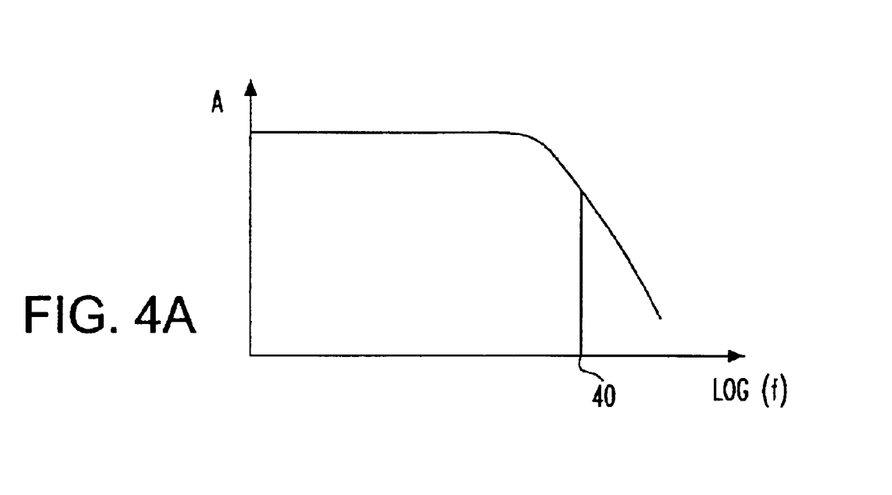
FIGS. 4A and 4B are Bode plots illustrating amplification versus frequency for the front stage receiver portions shown in FIGS. 3A and 3B, respectively.
Figure 4B:
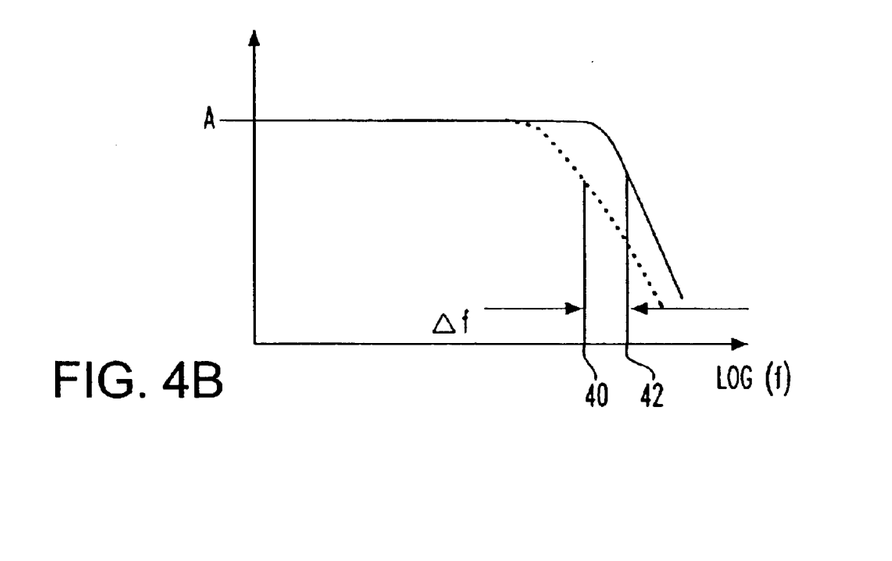

Bode plots illustrating gain versus frequency for the common source differential amplifier 301A and the peaking amplifier 301B are shown in FIGS. 4A and 4B, respectively. As illustrated in FIG. 4A, the gain, i.e. the amplification A, of the common source differential amplifier 301A is constant up to a certain frequency and then begins to decrease, eventually reaching a frequency 40 at which the amplification has decreased by half, i.e., the 3 dB frequency. By contrast, in FIG. 4B, the amplification A of the peaking amplifier 301B does not decrease at the same frequency 40 as the common source amplifier 301A, but rather, the bandwidth is extended from that frequency 40 by an additional amount Δf before it reaches its 3 dB frequency 42.

Some types of peaking amplifiers have increased gain at the top of their frequency ranges. However, as included in the signal detector 200 it is desirable for the peaking amplifier 301B to only extend the bandwidth without having increased gain. Maintaining an essentially flat frequency response in all signal frequency ranges is critical to avoid confusing high-frequency noise with a good signal. For these reasons, the values of the capacitor C1 and resistor R5 should be selected in a way that extends the bandwidth while maintaining an substantially flat frequency response.

As an alternative to a fixed value capacitor and fixed value resistor, a programmably adjustable capacitor can be provided which permits the capacitance value to be selected after the time of fabrication, e.g. during post-fabrication verification. In such manner, the peaking gain and extension of bandwidth can be adjusted at time of post-fabrication verification in a way that compensates for variations in the manufacturing process, or, alternatively, to adjust the signal detector to the particular frequency of the signals expected to be received thereby. Alternatively, the values of an adjustable capacitor C1 and/or the resistor R5 can even be adjusted thereafter, such as when the chip containing the signal detector 200 is placed in service to support a particular communication protocol.

Figure 5A:
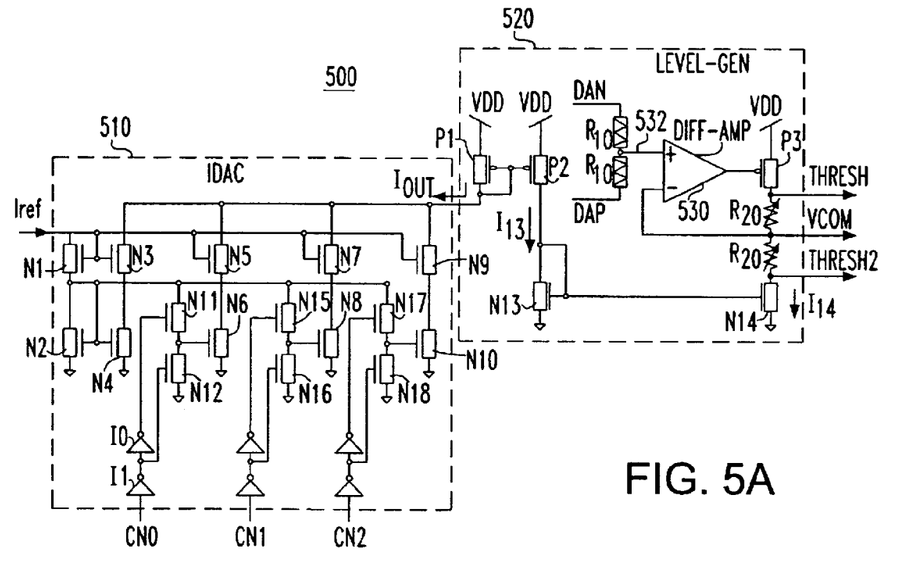
FIG. 5A is a schematic diagram illustrating a level detector for use in a signal detector according to an embodiment of the invention.

An exemplary implementation of a level generator 500 is illustrated in FIG. 5A, corresponding to the level generator 202 of FIG. 2. The level generator 202 satisfies an objective of a flexible signal detector 200 to have a programmable adjustable threshold level that is referenced to the signal level. In such manner, when the incoming signal has a lower level, the threshold level is set lower, and when the incoming signal has a higher level, the threshold level is set higher.

Figure 6A:
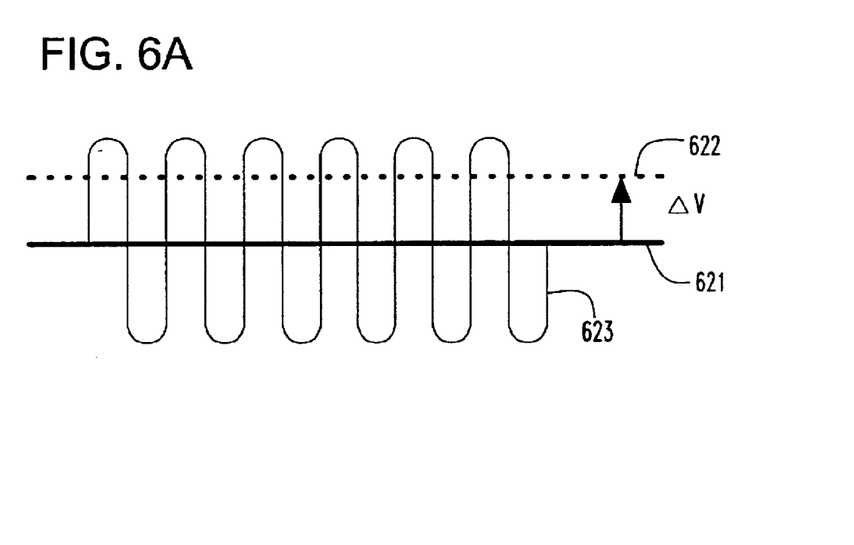
FIGS. 6A and 6B are waveform diagrams illustrating a single threshold and dual thresholds, respectively, in relation to a transitioning signal.
Figure 6B:
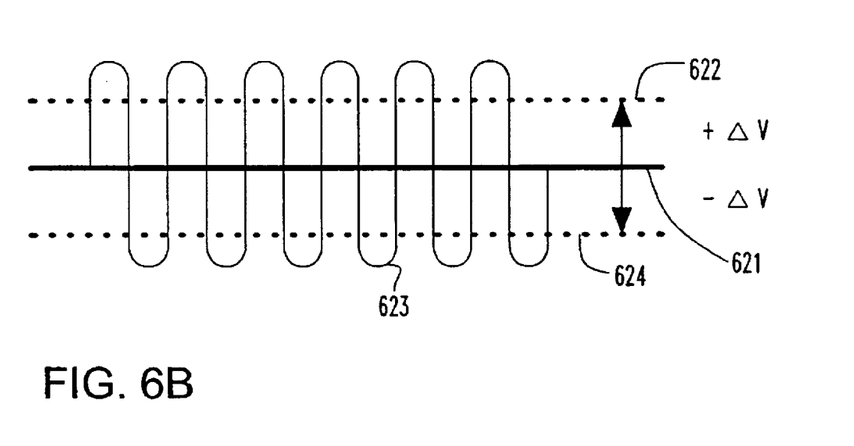

To save power and area, it is preferable to adopt a single-ended threshold level. As shown in FIG. 6A, a single-ended threshold level has one threshold level 622, set higher than the common mode voltage level 621 by ΔV, that level 622 being exceeded once per cycle of a normally transitioning signal 623. However, if additional performance benefits are needed in spite of the increased power and area requirements, an additional negative threshold level 624 can be provided, as shown in FIG. 6B. In such case, the positive and negative threshold levels 622, 624 are set at values varying equidistantly from the detected common mode level 621 by ΔV and ΔV, respectively, such that a normally transitioning signal 623 crosses the thresholds 622 and 624 twice per cycle.

As shown in FIG. 5A, the level generator 500 includes a current-based digital to analog converter (IDAC) 510 and a Level-Gen block 520 coupled thereto. The IDAC 510 generates a current of controlled magnitude for biasing the Level-Gen block 520 based on programming control inputs CN0, CN1 and CN2 provided hereto. The Level-Gen block 520 detects a common mode level VCOM of the re-generated differential signals DAN and DAP, and generates a threshold level THRESH referenced to VCOM.

In the IDAC 510, the three control inputs CN0, CN1 and CN2 are used to control the magnitude of an output current $I_{OUT}$ in relation to a reference current Iref input thereto. The magnitude of $I_{OUT}$ is the sum of the currents of a primary tail current path through the cascaded NFETs N3 and N4, plus the controllably selected ones of the currents of three auxiliary tail current paths: through a first path through cascaded NFETs N5, N6; a second path through NFETs N7 and N8; and a third path through NFETs N9, N10, respectively. By appropriate control through inputs CN0 through CN2, the IDAC 510 can produce a wide range of biasing output current values $I_{OUT}$. The relative sizes of each pair of transistors N5, N6; N7, N8; and N9, N10 are preferably selected to provide a broad range of selectable magnitudes of the output current $I_{OUT}$. For example, for an IDAC having three control signal bits CN0 through CN2 as here, the sizes of NFETs N7 and N8 can be doubled in relation to the size of NFETs N5 and N6 to produce an auxiliary current through NFETs N7 and N8 of twice the current through NFETs N5 and N6. The sizes of NFETs N9 and N10, in turn, can also be doubled in relation to the size of NFETs N7 and N8, to produce an auxiliary current through NFETs N9 and N10 which is doubled in relation to that of N7 and N8, and consequently is quadrupled in relation to the current flowing through N5 and N6.

The first auxiliary current path is selected by a high voltage level on the control input CN0 to turn on NFET N6. As a result, the output of the first inverter I1 turns off the pull down device N12 and the output of the second inverter 10 turns on NFET N11 to bias N6 for drawing a first current of controlled magnitude. Only the primary current path through NFETs N3 and N4 is normally kept on, while any of the three auxiliary current paths can be selectively switched on or off by the control inputs CN0, CN1 and CN2, in a manner such as that described for the current path through N5 and N6, turned on and off by the control input CN0.

As illustrated, the level generator 500 outputs a detected common mode level VCOM and a single-ended threshold level THRESH. The Level-Gen block 520 applies the controlled magnitude output current $I_{OUT}$ of the IDAC 510 to generate a biasing current $I_B$ which then powers a feedback path of differential amplifier 530 through a p-type insulated gate field effect transistor (PFET) P3, a resistor $R_{20}$ and a tail device N14.

The Level-Gen block 520 functions as a common mode voltage level detector including a resistive voltage divider having two identical value resistors $R_{10}$ each placed between different ones of the incoming differential signals DAN and DAP. The center node 532 of this voltage divider is connected to the positive input of the differential amplifier 530, the center node 532 having a voltage that is equal to the instantaneous average of the two signals DAN and DAP, i.e. the common mode voltage level of DAN and DAP. A feedback loop from the output of the differential amplifier 530, a p-type insulated gate field effect transistor (PFET) P3 at the output and a load resistor R3 back to a negative input of the differential amplifier 530 functions to produce an output common mode voltage level VCOM equal to the common mode voltage at the input 532 to the differential amplifier 530. In order to conserve power, the value of the resistors $R_{10}$ should preferably be large, but not so large as to consume excessive area of the chip.

The voltage threshold level (THRESH) is generated in reference to the detected common mode level VCOM. The voltage level of THRESH is determined by the voltage of VCOM plus the voltage difference across resistor $R_{20}$ as a result of the biasing current I14 through N14. In such way, the threshold level THRESH remains pegged to the common mode level VCOM, such that when a good signal is presented to the signal detector 200, it goes up when VCOM goes up by the same amount that VCOM goes up, and goes down when VCOM goes down by the same amount. The actual amount of the voltage difference between THRESH and VCOM is determined both by the magnitude of current 114 through N14 and the resistance of $R_{20}$. Thus, by varying the current 114 and/or the resistance $R_{20}$, the voltage difference between THRESH and VCOM can be tuned to a desirable level.

Optionally, a second voltage threshold level (THRESH2) can be generated which is lower than the detected common mode level VCOM and referenced to VCOM. The voltage level of THRESH2 is determined by the voltage of VCOM less the voltage difference across a second resistor $R_{20}$ as a result of the biasing current 114 through N14. In such way, the threshold level THRESH2 remains pegged to the common mode level VCOM, such that when a good signal is presented to the signal detector 200, it goes up when VCOM goes up by the same amount that VCOM goes up, and goes down when VCOM goes down by the same amount. The actual amount of the voltage difference between THRESH2 and VCOM is determined both by the magnitude of current $I_{14}$ through N14 and the resistance of $R_{20}$. Thus, by varying the current $I_{14}$ and/or the resistance $R_{20}$, the voltage difference between THRESH2 and VCOM can be tuned to a desirable level.

Figure 5B:
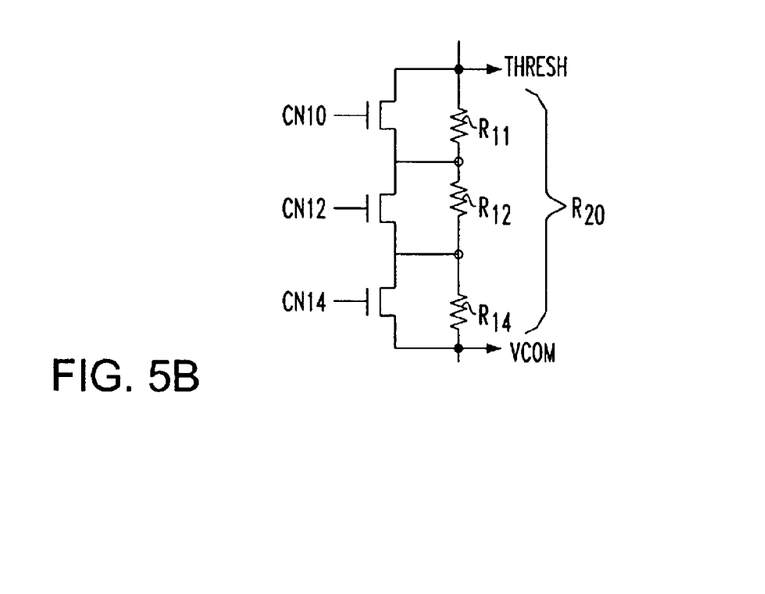
FIG. 5B is a schematic diagram illustrating a programmably controllable resistance element for use in the level detector illustrated in FIG. 5A.

As described above, the biasing current $I_{OUT}$ is programmably controlled through control inputs CN0, CN1 and CN2. That biasing current $I_{OUT}$ is reflected in the Level-Gen block 520 through the mirror transistor pair P2 and N13 as the bias current $I_B$ which is then further reflected in the current $I_{14}$ through the tail NFET N14. Alternatively, or in addition to controlling the threshold voltage level by controlling the magnitude of the current $I_{14}$, the resistance of $R_{20}$ can be adjustably varied. Such can be accomplished by providing $R_{20}$ as a programmably variable resistance element, for example, as an array of controllably selectable resistors R11, R12 and R14, as shown in FIG. 5B. In such case, the resistance value can be changed by control signals CN10, CN12 and CN14 input thereto for selectably bypassing individual resistors R11, R12 and R14, respectively.

Figure 7A:
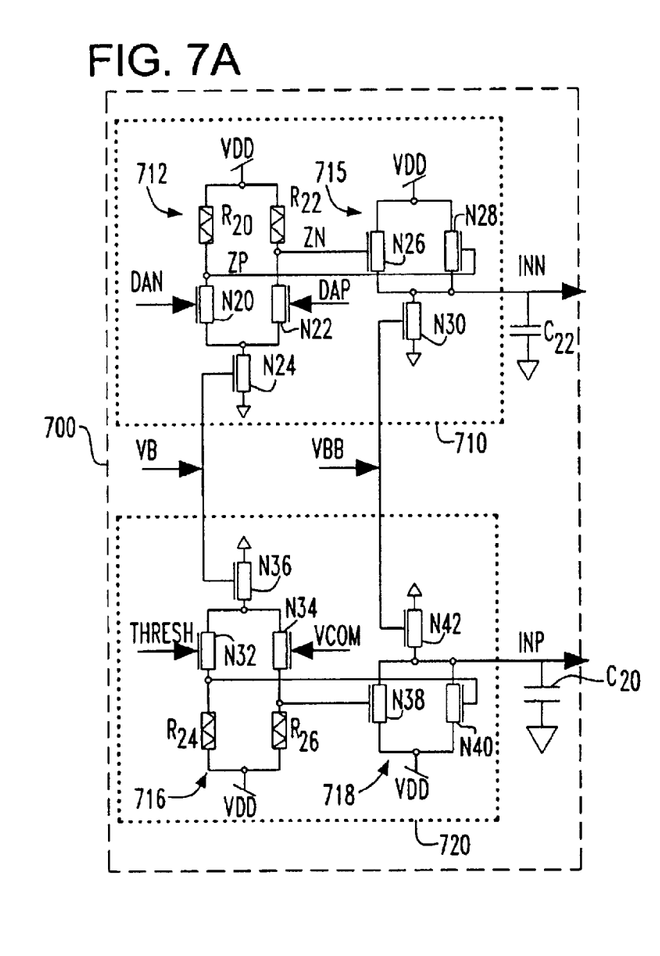
FIG. 7A is a schematic diagram illustrating a level generator for use in a signal detector according to an embodiment of the invention.

Referring to FIG. 2 again, the voltage threshold level THRESH, optionally a second voltage threshold level THRESH2, and the detected common mode level VCOM output from the level generator 202 are input to the level detector 203, as are the differential signals DAN and DAP. FIG. 7A illustrates a preferred implementation of a level detector 700 corresponding to the level detector 203 of FIG. 2. Level detector 700 functions to determine a time averaged signal level INN, and a time-averaged reference level INP which is averaged over a longer period of time than the signal level INN.

As shown in FIG. 7A, the level detector 700 includes a circuit 710 for generating a time-averaged reference level INN, and a circuit 720 for generating a time-averaged reference level INP. A circuit 710 includes a differential amplifier 712 coupled to a current amplifier 715, which, in turn, is coupled to the output node INN. Likewise, circuit 720 includes a differential amplifier 716 coupled to a current amplifier 718, which, in turn, is coupled to the output node INP.

The reference level INP is generated using the detected common mode level VCOM and the threshold level THRESH output from the level generator 202. The level detector 700 operates as a charge pump utilizing a principle of charge averaging in a circuit 720 to generate an averaged reference level INP. For each interval in which THRESH exceeds VCOM, transistor N32 of the differential amplifier 712 is turned on to a greater extent than a transistor N34, such that the voltage output at the drain of transistor N34 is higher than the voltage output at the drain of N32. During such interval, the node INP at the sources of transistors N38 and N40 is elevated above a quiescent level that exists when THRESH and VCOM are of the same level. Likewise, for every interval in which VCOM exceeds THRESH, transistor N34 is turned on to a greater extent than a transistor N32, such that the voltage output at the drain of transistor N32 is higher than the voltage output at the drain of N34. During that such interval, the node INP at the sources of transistors N38 and N40 is also elevated above the quiescent level. In either case, the elevated voltage at INP is applied to charge a relatively high-capacitance capacitor C20 coupled between INP and ground whenever there is a voltage difference between THRESH and VCOM. Because of the capacitor C20, INP is only able to vary only slowly such that INP is generated as a reference level that is averaged over a relatively long period of time.

When a second threshold level THRESH2 is provided to the level generator 700, a second instance of the circuit 720 is provided, having THRESH2 and VCOM input thereto, and operating in a manner similar to that described above to generate a second reference level INP2.

A similar circuit 710 generates the time-averaged signal level INN. In this case, the differential signals DAN and DAP are applied to the gates of NFETs N20 and N22, respectively. As a result, one or the other of transistors N26 or N28 is turned on to a greater extent whenever the signal DAN varies from the signal DAP. At such times, more current flows from the voltage supply VDD towards the output node INN to charge the capacitance C22 which, in an embodiment of the invention, is sufficient to the extent provided in parasitic elements of the circuit 710. Alternatively, a capacitor can be specifically provided if the capacitance C22 of the parasitic elements is not desirably large. As the capacitance C22 is smaller than the capacitance of capacitor C20, the time averaging of the signal level INN occurs over a shorter period of time than that of the reference level INP. In operation, when the difference between the levels of DAN and DAP is higher than the threshold level THRESH, the internal node voltage INN rises to a level above the reference level INP. Otherwise, when the difference between the levels of DAN and DAP are below THRESH, the generated signal level INN will fall below the reference level INP.

By examining the differential amplifiers 712 and 716, it is apparent that they cannot operate if the signals DAN and DAP, and THRESH and VCOM that are input thereto, respectively, have high common mode voltage levels that are close to the voltage supply level VDD. Referring to FIG. 2, such is the reason for adjusting the common mode voltage level in the front stage receiver 201 portion of the signal detector 200. In addition, the effectiveness of the differential amplifier 712 in charging the capacitance C22 is very dependent upon the bandwidth of the signals DAN and DAP input thereto from the front stage receiver 201. Hence, providing a front stage receiver 201 having a bandwidth at least as high as the signals DATAN and DATAP input thereto is needed in order to generate a signal level INN that accurately reflects the presence of high frequency signals DATAN and DATAP.

Figure 7B:
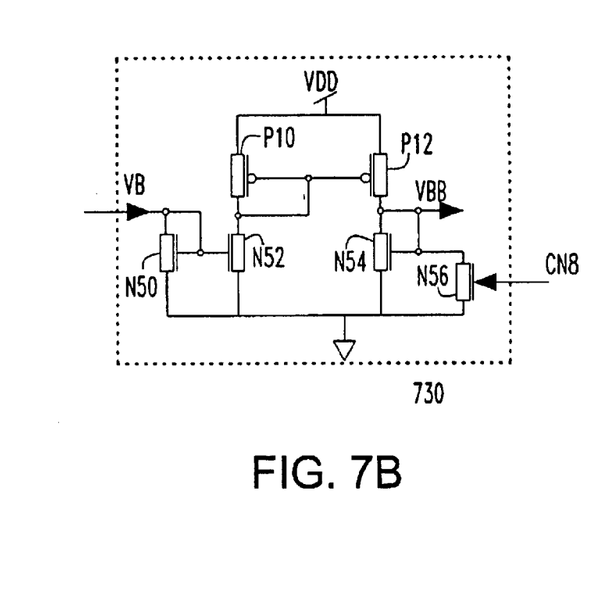
FIG. 7B is a schematic diagram illustrating a circuit for generating a second voltage bias level from a first voltage bias level, for use in a level generator portion as shown in FIG. 7A.

The circuits 710 and 720 require a biasing voltage VB to operate the differential amplifiers 712 and 716 of each circuit, and a biasing voltage VBB preferably of a different magnitude to operate the current amplifiers 715 and 718 of each circuit. As shown in FIG. 7B, the biasing voltage VBB is generated by a current mirror circuit 730 having a magnitude which is controlled relative to a biasing voltage VB. The biasing voltage VBB is preferably turned on and off by a control signal CN8 provided to the gate of a transistor N56 and thereby turn on and off the signal detector 200.

Figure 8:
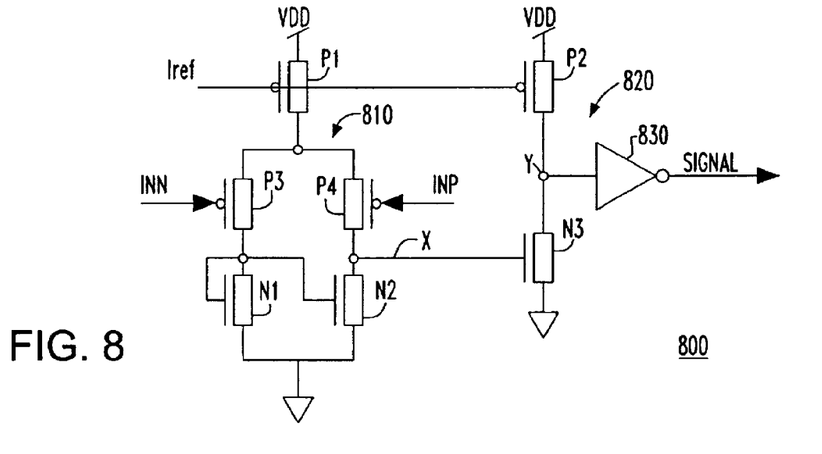
FIG. 8 is a block and schematic diagram illustrating a comparator portion of a signal detector according to an embodiment of the invention.

The time-averaged signal level INN and the reference level INP are input to a self-biased comparator 800, which then determines whether or not a signal is present on the lines DATAN and DATAP. The comparator 800 includes a comparison stage 810, a transfer stage 820 and an output inverter stage 830. The comparison stage 810 includes a PFET head device P1 which is biased by a reference current Iref, two PFETs P3 and P4 to which the averaged signal level INN and the reference level INP are applied as inputs to the comparator, and a pair of self-biased current mirror NFETs N1 and N2. NFET N1 has a drain and a gate thereof connected together to operate N1 as a diode, and the current flowing through that diode N1 is then mirrored to NFET N2 to provide self-bias.

In operation, when the reference level INP is higher than the signal level INN, the PFET P4 is turned off more strongly than P3 such that the output node X then discharges to a low level through NFET N2 which is turned on at that time. In turn, the low-level at node X turns off NFET N3 of the transfer stage 820. As a result, the intermediate node Y is charged to a high level by PFET P2. The inverter 830 then inverts the high level at node Y such that the output SIGNAL falls low, indicating that no signal is detected.

On the other hand, when the signal level INN is higher than the reference level INP, PFET P3 will be turned off more strongly than PFET P4, such that the node X will be charged to a high level. As a result, NFET N3 will then be turned on and the intermediate node Y will be discharged to a low level. Finally, the low level at node Y is then inverted to produce a high output SIGNAL, thus indicating the presence of a signal on the input lines DATAN and DATAP.

In a particular example of operation, when signals DATAN and DATAP are not transitioning, but instead have a "stuck-at-high" condition in which both are at shorted to the power supply level, the time-averaged signal level INN and the reference level INP both rise the voltage supply level Vdd, such that both transistors P3 and P4 of comparator 800 are turned off at that time, with the result again that SIGNAL falls low to indicate loss-of-signal.

In an alternative embodiment, when a second, optionally provided second reference level INP2 is utilized, a second instance of the comparator 800 (not shown) is provided in the signal detector 200. Such optionally provided second reference level INP2 is generated from a second, lower voltage threshold level THRESH2 that lies below a common mode level of the differential input signal. In the second instance of a comparator 800, the second reference level INP2 is input to the comparator in place of the reference level INP. In such example, the second reference level INP2 is compared against the time-averaged signal level INN in a manner like that described above for the reference level INN to detect whether or not a signal is present.

Figure 9:
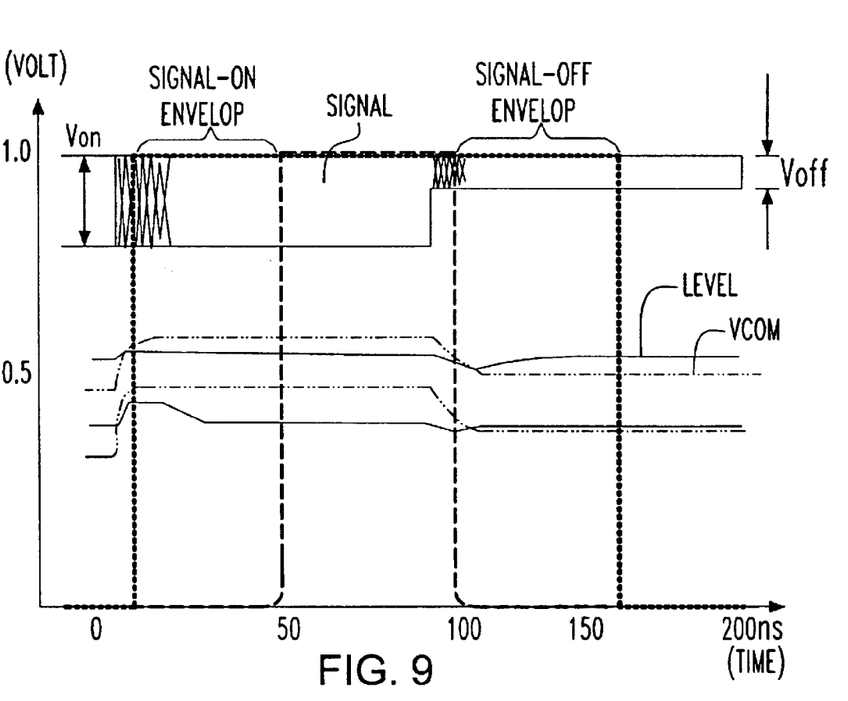
FIG. 9 is a timing diagram illustrating results of a statistical analysis of operation of a signal detector according to an embodiment of the invention.

The results of a statistical analysis of the operation of signal detector 200 are illustrated in FIG. 9. The conditions for the statistical analysis are as follows. The temperature range is set to 0 degrees to 125 degrees C. Conditions are selected such that the signal transitions between low and high levels according to a normal random number pattern ranging between 0.1 to 0.9 for an incoming data rate of 250 Mbs and Vdd=1.0 V. As illustrated in FIG. 9, the signal detector 200 successfully detects a good signal within a signal-on envelope time of 50 ns for a signal amplitude above 200 mV (Von). When there is no signal present, the signal detector 200 detects that condition within a signal-off envelop time of 50 ms whenever the signal level falls below 70 mV.

Table 1 illustrates a set of conditions under which the signal detector is operated in an exemplary embodiment.

| | Vector Settings | | | |
| --- | --- | --- | --- | --- |
| | Spec A; peak-to-peak amplitude (120–25 mV) | | Spec B; peak-to-peak amplitude (200–70 mV) | |
| Transmission Rate | 2.5 Mbps | 6.4 Gbps | 2.5 Mbps | 6.4 Gbps |
| Power Supply = 1.0 V | (1, 0, 0) | (0, 1, 0) | (1, 0, 1) | (1, 0, 1) |
| Power Supply = 1.0 V | (0, 0, 0) | (1, 0, 0) | (0, 0, 1) | (0, 0, 1) |

Referring again to FIG. 1A and the accompanying description above, an up-channel driver 27 is preferably provided for sending test data from the receiver 10 to a remote transmitter 32 at the other end of a link when the SerDes Core is either initially powered on or during a test. The up-channel driver 27 is then used to test the functionality of the signal detector 26. A low frequency test pattern can be generated in a logic block 29 and then input to the signal detector 26 via the up-channel driver 27.

Figure 10:
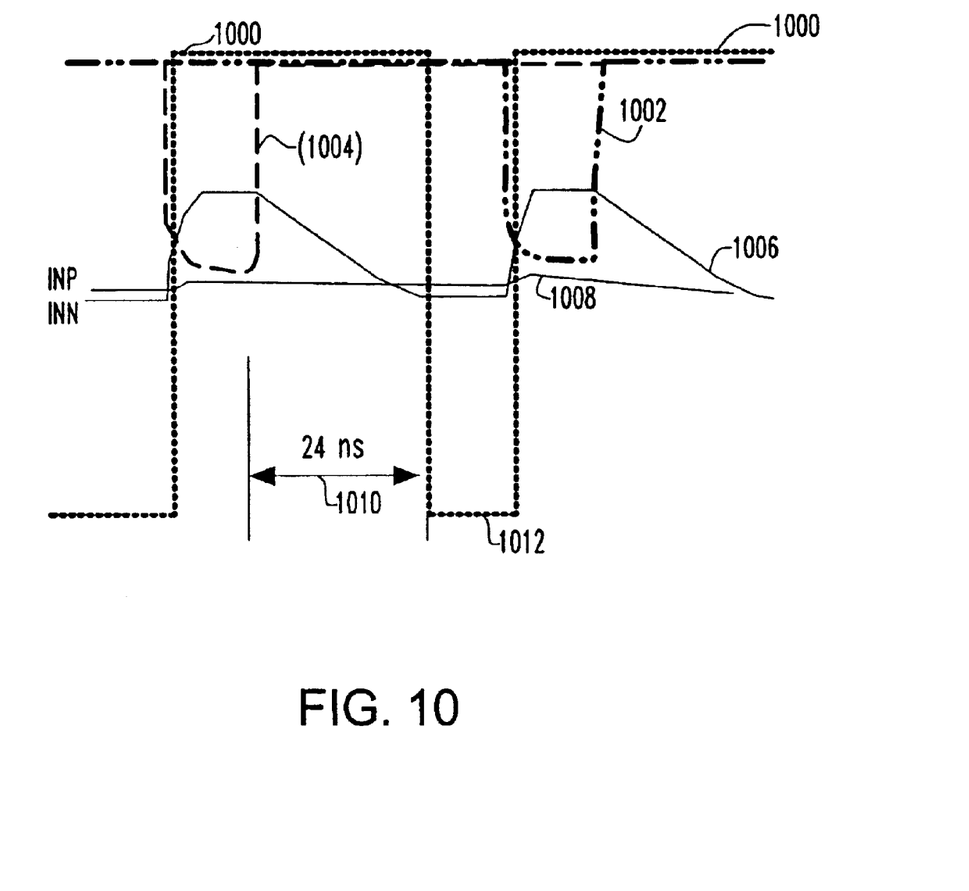
FIG. 10 is a timing diagram illustrating operation during a test mode of a signal detector according to an embodiment of the invention.

As shown in FIG. 10, the signal detector 200 is able to detect the presence of a signal to provide an output "SigDet" 1000 when a "one" signal appears (1002) as well as a "zero" signal (1004). In this waveform diagram, the signal level (INN 1006) and the reference level (INP 1008) are also shown. FIG. 10 also indicates that when the incoming differential signals are both "stuck-at-high", i.e., shorted to the power supply level, as occurs during time 1010, the signal detector detects the bad signal after about 24 ns, then falling to a low level 1012. This is a nominal time for the sense line to be discharged.

A CMOS signal detector 26 is provided which is capable of detecting loss-of-signal, as well as indicating a good signal, when present, for a high-speed serial link (HSS) core. The signal detector 26 is operable over a wide range of data transmission rates and power supply voltages. An on-chip programmable threshold level setting device is implemented to provide for flexible control thereover. The signal detector is capable of detecting good and bad signals within a 50 ns time period so that the HSS core system responds rapidly to a loss-of-signal condition. The signal detector in this design can be on-chip tested using an up-channel driver. A peaking amplifier is optional to be used for the front stage of the detector.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of detecting loss of signal on a pair of differential signal lines operable to carry a differential signal, comprising:

detecting a common mode level from voltages on said pair of differential signal lines;

generating a threshold level referenced to said detected common mode level;

generating a signal level from the voltages on said pair of differential signal lines, said signal level being averaged over a first period of time;

generating a reference level from said threshold level and said detected common mode level, said reference level being averaged over a second period of time longer than said first period of time;

comparing said signal level to said reference level to determine if a signal is present on said pair of signal lines.

2. The method of claim 1 wherein said signal level is averaged by charging said signal level with a charge pump operated by said voltages on said pair of signal lines.

3. The method of claim 2 wherein said reference level is averaged by charging said reference level with a charge pump operated by said threshold level and said common mode level.

4. The method of claim 1 wherein said comparing is performed by a self-biased comparator.

5. The method of claim 1 further comprising buffering levels on a pair of conductors to generate said voltages on said pair of signal lines.

6. The method of claim 5 wherein said buffering shifts a common mode level on said pair of conductors to a different common mode level on said pair of signal lines.

7. The method of claim 1 wherein said buffering is performed by connecting said conductors to a peaking differential amplifier having a peak sensitivity which is adjustable to a switching frequency of said pair of differential signals adapted to be carried by said pair of signal lines.

8. The method of claim 1 wherein said threshold level is generated by programmably adjusting a bias current to generate a resistive voltage drop referenced to said common mode level.

9. The method of claim 1 wherein said threshold level is generated by programmably adjusting a resistance of a resistive element to generate a voltage drop referenced to said common mode level.

10. The method of claim 1 wherein said threshold level is a first threshold level at a higher voltage than said common mode level, said reference level being generated from said first threshold level, said method further comprising generating a second threshold level at a lower voltage than said common mode level, generating a second reference level from said second threshold level, and comparing said signal level to said second reference level to determine if a signal is present on said pair of signal lines.

11. The method of claim 1 wherein said common mode is detected by resistively dividing a voltage difference between said voltages on said pair of signal lines.

12. The method of claim 1 wherein said comparing determines that no signal is present when said signal level does not exceed said reference level.

13. A method of detecting loss of signal on a pair of conductors adapted to carry a pair of differential signals, comprising:

generating voltages on a pair of signal lines by buffering levels on a pair of conductors;

detecting a common mode level of said voltages on said pair of signal lines;

generating a threshold level referenced to said detected common mode level;

generating a short-term averaged signal level by operating a first charge pump with said voltages on said pair of signal lines;

generating a reference level averaged over a longer term than said signal level by operating a second charge pump with said threshold level and said common mode level;

comparing said signal level to said reference level to determine if a signal is present on said pair of signal lines, said comparing determining that a signal is not present when said signal level is less than or equal to said reference level.

14. An apparatus for detecting loss of a signal on a pair of signal lines adapted to carry a pair of differential signals, comprising:

a level generator operable to detect a common mode level of voltages on a pair of signal lines and operable to generate a threshold level referenced to said detected common mode level;

a first charge pump operable by said voltages on said pair of signal lines to generate a short-term averaged signal level;

a second charge pump operable by said threshold level and said common mode level to generate a reference level averaged over a longer term than said signal level; and a comparator operable to compare said signal level to said reference level to determine if a signal is present on said pair of signal lines.

15. The apparatus of claim 14 further comprising an amplifier operable to buffer levels on a pair of conductors to generate said voltages on said pair of signal lines.

16. The apparatus of claim 15 wherein said amplifier is further operable to shift a common mode level on said pair of conductors to a different common mode level on said pair of signal lines.

17. The apparatus of claim 15 wherein said amplifier includes a peaking differential amplifier having extended bandwidth, said peaking differential amplifier being operable to shift a common mode level on said pair of conductors to a different common mode level on said pair of signal lines.

18. The apparatus of claim 14 wherein said comparator is a self-biased comparator.

19. The apparatus of claim 14 wherein said level generator includes a programmably adjustable bias current generator for use in generating said threshold level by a resistive voltage drop referenced to said common mode level.

20. The apparatus of claim 14 wherein said level generator includes a programmably adjustable resistive element for use in generating said threshold level by a resistive voltage drop referenced to said common mode level.

21. The apparatus of claim 14 wherein said level generator is operable to detect said common mode by resistively dividing a difference between said voltages on said pair of signal lines.

22. The apparatus of claim 14 wherein said comparator is operable to determine that no signal is present when said signal level does not exceed said reference level.

23. An apparatus for detecting loss of a signal on a pair of signal lines adapted to carry a pair of differential signals, comprising:

level generating means for detecting a common mode level of a pair of voltages on a pair of signal lines and for generating a threshold level referenced to said detected common mode level;

means for generating a short-term averaged signal level with said voltages on said pair of signal lines;

means for generating a reference level averaged over a longer term than said signal level; and means for comparing said signal level to said reference level to determine if a signal is present on said pair of signal lines.

24. The apparatus of claim 23 wherein said means for generating said signal level is operable to average said signal level with a first charge pump operated by said voltages on said pair of signal lines.

25. The apparatus of claim 24 wherein said means for generating said reference level is operable to average said reference level with a second charge pump operated by said threshold level and said common mode level.

26. The apparatus of claim 23 further comprising means for buffering levels on a pair of conductors to generate said voltages on said pair of signal lines.

27. The apparatus of claim 26 wherein said means for buffering is further operable to shift a common mode level of said voltages on said pair of conductors to a different common mode level on said pair of signal lines.

28. The apparatus of claim 27 wherein said means for buffering includes a peaking differential amplifier connected to said pair of conductors, said differential amplifier having a peak sensitivity which is adjustable to a switching frequency of a signal which said pair of signal lines are designed to carry.

29. The apparatus of claim 23 wherein said level generating means includes programmably adjustable bias current means for generating a resistive voltage drop referenced to said common mode level.

30. The apparatus of claim 23 wherein said level generating means includes a programmably adjustable resistive element for generating a resistive voltage drop referenced to said common mode level.

31. The apparatus of claim 23 wherein said level generating means includes means for resistively dividing a difference between said voltages on said pair of signal lines.

32. The apparatus of claim 23 wherein said means for comparing is operable to determine that no signal is present when said signal level is the same as said reference level.

33. The apparatus of claim 23 wherein said means for comparing is operable to determine that no signal is present when said signal level is below said reference level.

* * * * *